US009516757B2

(12) United States Patent
He et al.

(10) Patent No.: US 9,516,757 B2
(45) Date of Patent: Dec. 6, 2016

(54) ELECTRIC CONNECTOR, PLUG-IN MODULE THEREOF AND METHOD FOR MANUFACTURING PLUG-IN MODULE

(71) Applicant: DELTA ELECTRONICS (Chen Zhou) CO., LTD., Chen Zhou (CN)

(72) Inventors: Wangjun He, Chen Zhou (CN); Jung-jui Wang, Chen Zhou (CN); Shaofeng Yu, Chen Zhou (CN)

(73) Assignee: DELTA ELECTRONICS (CHEN ZHOU) CO. LTD. (CN)

( * ) Notice: Subject to any disclaimer, the term of this patent is extended or adjusted under 35 U.S.C. 154(b) by 19 days.

(21) Appl. No.: 14/688,443

(22) Filed: Apr. 16, 2015

(65) Prior Publication Data

US 2015/0373860 A1 Dec. 24, 2015

(30) Foreign Application Priority Data

Jun. 19, 2014 (CN) .......................... 2014 1 0275598

(51) Int. Cl.
*H05K 1/14* (2006.01)
*H05K 1/18* (2006.01)
(Continued)

(52) U.S. Cl.
CPC ................ *H05K 1/181* (2013.01); *H04Q 1/00* (2013.01); *H05K 1/14* (2013.01); *H05K 3/366* (2013.01);
(Continued)

(58) Field of Classification Search
CPC ......... H01R 12/71; H01R 12/16; H01R 13/66; H01R 13/646; H01R 13/648; H01R 13/719
USPC ..... 361/728–730, 736–737; 439/676, 620.15
See application file for complete search history.

(56) References Cited

U.S. PATENT DOCUMENTS 6,659,807 B1 * 12/2003 Zheng .................... H01R 24/64
439/541.5
6,739,915 B1 * 5/2004 Hyland ............ H01R 13/65802
439/676
(Continued)

FOREIGN PATENT DOCUMENTS

| CN | 101728671 | 6/2010 |
| CN | 102237586 | 11/2011 |
| TW | M437561 | 9/2012 |

OTHER PUBLICATIONS

Office Action dated Jun. 27, 2016 from corresponding No. TW 103136958.

*Primary Examiner* — Hung S Bui
(74) *Attorney, Agent, or Firm* — Hauptman Ham, LLP

(57) ABSTRACT

An electric connector, a plug-in module thereof and a production method of the plug-in module are provided. The plug-in module comprises a base, an input unit, an output unit and an output end. The base comprises a top plate, a bottom plate and one connection plate. A plurality of input terminals and a plurality of intermediate terminals are fixed to the base. The input unit comprises one input circuit board provided vertically to the base and electrically coupled to an end portion of the input terminals. At least one channel are provided on the input circuit board. Each channel comprises a transformer electrically coupled to the input circuit board. The output unit comprises an output circuit board horizontally provided to the base and electrically coupled to the input circuit board via the intermediate terminals. The output end are fixed to and electrically coupled to the output circuit board.

19 Claims, 12 Drawing Sheets

(51) Int. Cl.
*H04Q 1/00* (2006.01)
*H05K 3/36* (2006.01)

(52) U.S. Cl.
CPC .............. *H05K 2201/047* (2013.01); *H05K 2201/10189* (2013.01); *H05K 2201/10303* (2013.01); *H05K 2201/10424* (2013.01); *H05K 2201/10757* (2013.01); *Y10T 29/49119* (2015.01)

(56) References Cited

U.S. PATENT DOCUMENTS

| | | | | |
|---|---|---|---|---|
| 7,153,158 B1* | 12/2006 | Lee | .................... | H01R 13/6658 439/541.5 |
| 7,517,254 B2* | 4/2009 | Zhang | ................ | H01R 13/6658 439/541.5 |
| 7,837,511 B2* | 11/2010 | Hsu | .................... | H01R 13/6658 439/490 |
| 7,959,473 B2 | 6/2011 | Machado et al. | | |
| 8,403,701 B2* | 3/2013 | Han | .................. | H01R 13/6594 439/541.5 |
| 8,579,660 B2* | 11/2013 | Chow | .................. | H01R 12/724 439/540.1 |
| 2007/0015416 A1* | 1/2007 | Gutierrez | ............... | H01R 24/64 439/676 |
| 2009/0145637 A1* | 6/2009 | Kanouda | ............. | H05K 3/0061 174/255 |
| 2015/0048917 A1* | 2/2015 | Uchiyama | ................ | H05K 3/28 336/200 |
| 2016/0049757 A1* | 2/2016 | Hou | .................. | H01R 13/6633 439/620.15 |

* cited by examiner

… (1) …

ELECTRIC CONNECTOR, PLUG-IN MODULE THEREOF AND METHOD FOR MANUFACTURING PLUG-IN MODULE

TECHNICAL FIELD

The present disclosure generally relates to an electric connector mainly used in transmission of data signal over network communication, a plug-in module of the electric connector and a method for manufacturing plug-in module.

BACKGROUND

An electric connector is generally required to connect electronic devices with the network or other related electronic devices.

Chinese Patent Application No. 201010042725.9 discloses a network connector having a filter. The network connector includes a housing, a box provided in the housing, a plastic back shell, a PCB board fixed to the plastic back shell, plug terminals, an annular magnetic master slice and pins. The pins are inserted inside from a bottom of the plastic back shell and welded onto the PCB board.

Such a traditional network connector has only one PCB board, and all of the plug terminals, transformers, the pins are directly welded to the PCB board. Thus, the production of the PCB board is a trouble and inefficient. Moreover, it is difficult to determine an exact location of a failure point during detection of the PCB board, and it is not conducive to maintenance. Further, if the exact failure point cannot be found, the whole PCB board and components thereon have to be replaced, which is wasteful and increases the cost of the network connector.

The above information disclosed in the Background only intends to better understand the backgrounds of the disclosure, so the Background may include information which does not belong to the prior art known by those skilled in the art.

SUMMARY

According to an aspect of the present disclosure, a plug-in module which is convenient in production and easy to detect a failure point and a production method thereof are provided, so that the deficiencies of the prior art may be overcome.

According to another aspect of the present disclosure, an electric connector mounted with the plug-in module according to the present disclosure is provided.

Advantages of the disclosure will in part set forth in the description below, and in part will become obvious from the description, or may be learned from practice of the present disclosure.

According to an exemplary embodiment of the present disclosure, a plug-in module includes a base, an input unit, an output unit and an output end. The base includes a top plate, a bottom plate and at least one connection plate connecting the bottom plate and the top plate, and a plurality of input terminals and a plurality of intermediate terminals are fixed to the base; the input unit includes at least one input circuit board and at least one channel. The at least one input circuit board is provided vertically to the base, and is electrically coupled to an end portion of the input terminals; the at least one channel is provided on the input circuit board, and each of the at least one channel includes a transformer electrically coupled to the input circuit board. An output unit comprises an output circuit board. The output circuit board is horizontally provided to the base, and the output circuit board is electrically coupled to the input circuit board via the intermediate terminals. The output end is fixed to and electrically coupled to the output circuit board.

According to another exemplary embodiment of the disclosure, an electric connector includes an insulator, a housing and at least one plug-in module. In the insulator, at least one module socket is provided along a direction from back to front, at least one docking socket is provided along a direction from front to back, and the docking socket and module socket opposed to the docking socket are interconnected with each other. The housing is located outside the insulator. The at least one plug-in module is plugged into the at least one module socket correspondingly, and the plug-in module is the plug-in module according to the present disclosure.

According to another exemplary embodiment of the present disclosure, a method for manufacturing plug-in module includes the following steps: a base, on which a plurality of input terminals and a plurality of intermediate terminals are fixed, is provided; an input unit including at least one input circuit board is provided, wherein each of the at least one input circuit board includes at least one channel provided thereon and each of the at least one channel comprises a transformer electrically coupled to the input circuit board; an output unit including an output circuit board is provided; the at least one input circuit board is vertically provided to the base, wherein the input circuit board is electrically coupled to an end portion of the input terminal; the output circuit board is horizontally provided to the base, wherein the output circuit board is electrically coupled to the input circuit board via the intermediate terminal; and an output end is provided so as to be fixed to and electrically coupled to the output circuit board.

The plug-in module according to one embodiment includes a base, an input unit, an output unit and an output end which may be relatively independent. The output end may be fixed to and electrically coupled to the output unit during assembling, and then, the input unit and the output unit are assembled to the base. So the assembly may be very easy.

Each of the base, the input unit and the output unit, etc., according to one embodiment, may be produced separately and automatically without affecting each other. Thus, productivity may be improved significantly.

The input circuit board is vertically provided to the base, and the output circuit board is horizontally provided to the base. Due to such arrangement, it is possible to reasonably arrange the elements and components on the input circuit board and the output circuit board, such that the space of the base may be fully utilized to reduce the volume of the plug-in module.

BRIEF DESCRIPTION OF THE DRAWINGS

The above and other features and advantages of the present disclosure will become more apparent from the detailed description of exemplary embodiments thereof with reference to accompany drawings.

DETAILED DESCRIPTION

Figure 1:
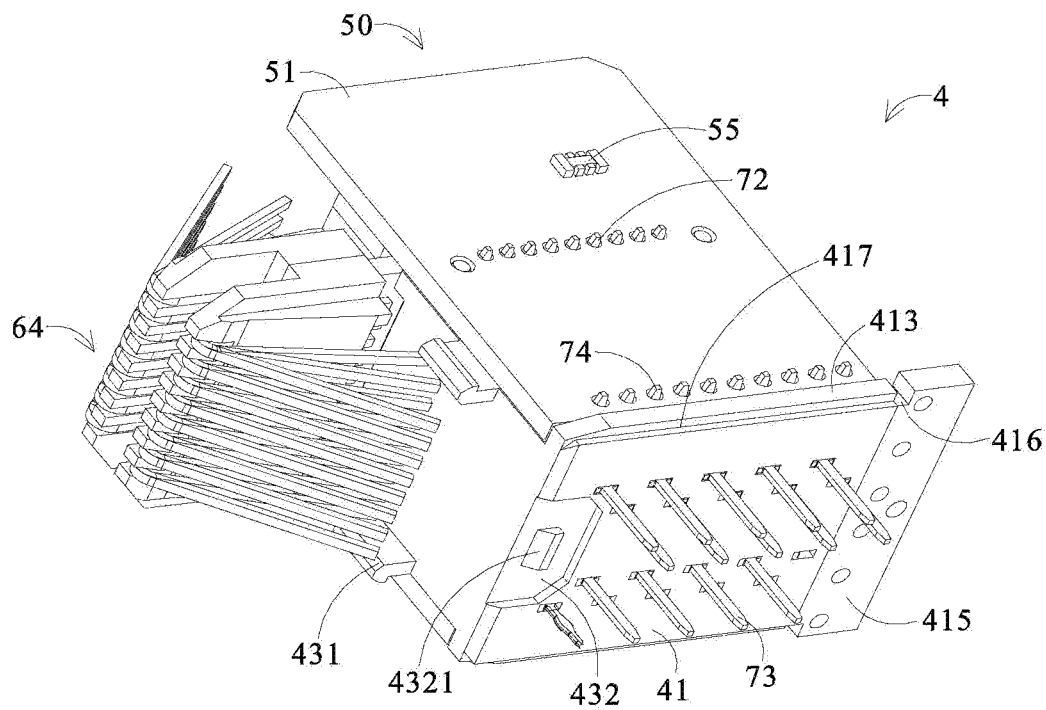
FIG. 1 is a schematic view of a first embodiment of a plug-in module according to the present disclosure.

Now, the exemplary embodiments will be described more fully with reference to the accompany drawings. However, the exemplary embodiments can be implemented in various forms and should not be construed as limited to the embodiments set forth herein. Instead, these embodiments are provided so that this disclosure will be thorough and complete, and the concept of the exemplary embodiment will be fully conveyed to those skilled in the art. Same reference numerals denote the same or similar structures in the accompany drawings, and thus the detailed description thereof will be omitted.

A First Embodiment of a Plug-in Module

With reference to FIGS. 1 to 6, a plug-in module 4 according to a first embodiment of the present disclosure includes a base 40, an input unit 50, an output unit 60, an output end 64, a plurality of input terminals and a plurality of intermediate terminals.

Figure 4:
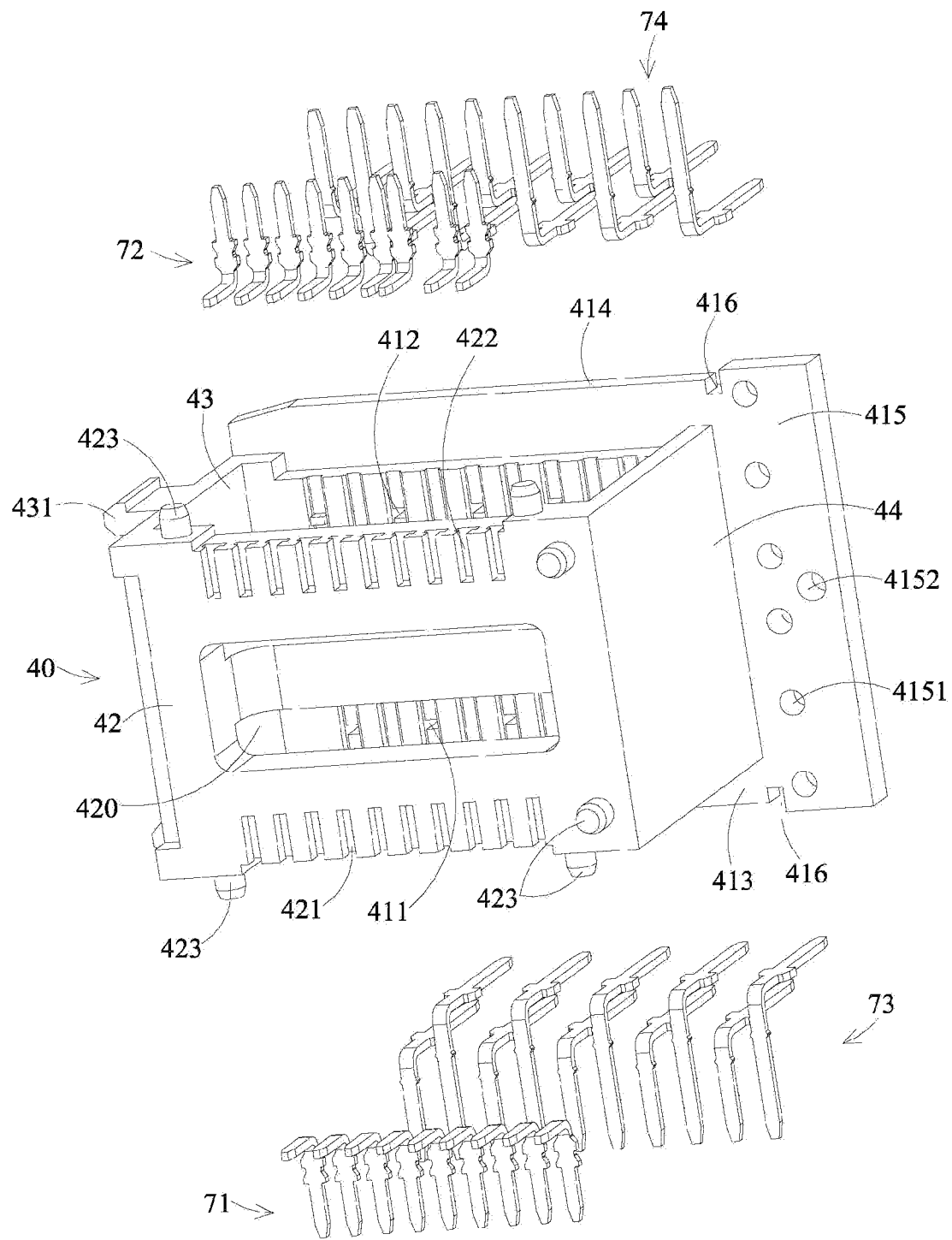
FIG. 4 a schematic view of a base of the first embodiment of the plug-in module according to the present disclosure.
Figure 5:
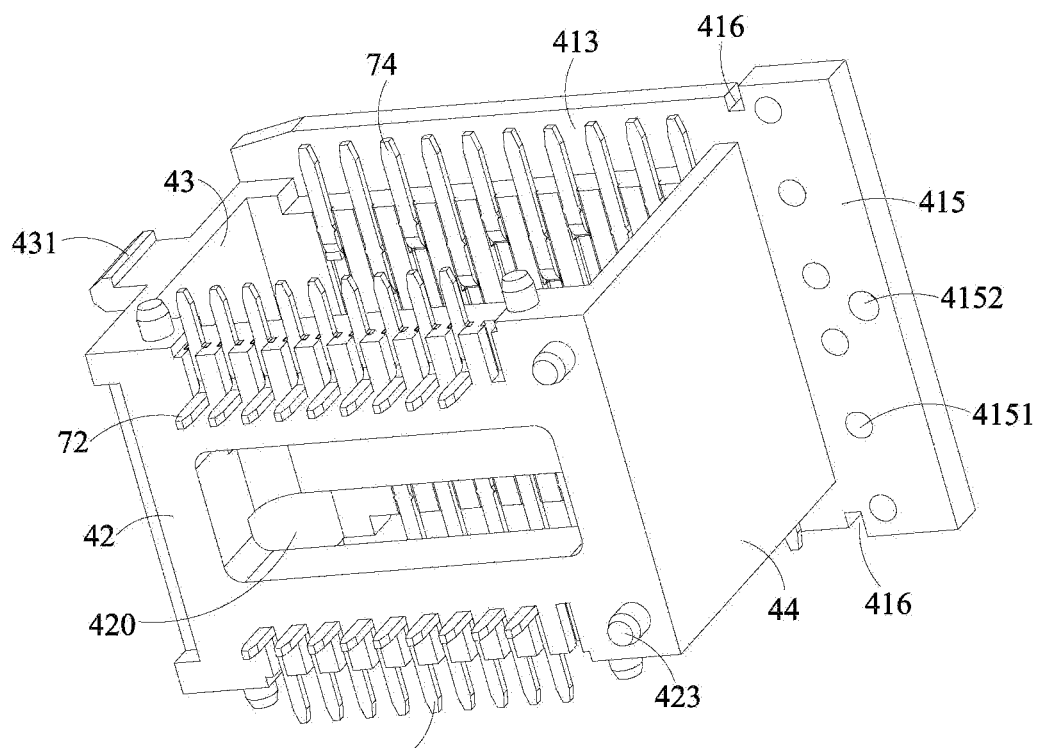
FIG. 5 is a schematic view of an assembly of the first embodiment of the base and terminals of the plug-in module according to the present disclosure.

With reference to FIGS. 4 and 5, the base 40 includes a bottom plate 41 and a top plate 42 disposed opposite to each other, and includes a front plate 43 connecting front end portions of the bottom plate 41 and the top plate 42, and a back plate 44 connecting back end portions of the bottom plate 41 and the top plate 42. In the first embodiment, the bottom plate 41, the top plate 42, the front plate 43 and the back plate 44 form a rectangular frame together. In other embodiments, the bottom plate 41, the top plate 42, the front plate 43 and the back plate 44 may also together form a frame with other shapes such as a trapezoidal shape. In addition, in other embodiments, the back plate 44 may not be provided. Further, the front plate 43 may also be referred to as, but not limited to, a connection plate connecting the bottom plate 41 and the top plate 42.

The top plate 42 may be provided with a central through hole 420. Left and right sides of the top plate 42 may be respectively provided with intermediate terminal slots, i.e., a first intermediate terminal slot 421 and a second intermediate terminal slot 422. Left and right sides of the bottom plate 41 may be respectively provided with input terminal slots, i.e., a first input terminal slot 411 and a second input terminal slot 412.

The plurality of intermediate terminals are divided into four groups, i.e., a first group of intermediate terminals 71, a second group of intermediate terminals 72, a first group of input terminals 73 and a second group of input terminals 74. The four groups of terminals are respectively fixed to the first intermediate terminal slot 421, the second intermediate terminal slot 422, the first input terminal slot 411 and the second input terminal slot 412. Each of the terminals or the input terminals is in a shape of "L", and has a first end portion and a second end portion, but the invention is not limited to this. The first end portion and the second end portion of each of the intermediate terminals and the input terminals are respectively pointed to a direction away from the base 40.

The left side and the right side of the bottom plate 41 may respectively extend outward, so as to form a left extension portion 413 (see FIG. 2) and a right extension portion 414 (see FIG. 4). A bottom surface of the bottom plate 41 is provided with a groove 417 recessed toward a top surface (a surface facing to the top plate 42) of the bottom plate 41.

The back end portion of the bottom plate 41 may extend backward to form a back extension portion 415. A first positioning hole 4151 and a second positioning hole 4152 may be formed on the back extension portion 415. There may be a plurality of first positioning holes 4151 disposed in a row adjacent to the back plate 44. There may be one or more the second positioning holes 4152 disposed far away from the back plate 44. The left extension portion 413 and the right extension portion 414 may be respectively provided with a recess 416 which is formed on a location adjacent to the back extension portion 415. A ground pin of a housing 12 may be connected to a customer circuit board through the recesses 416 and the groove 417.

Left side and right side of the front plate 43 may be respectively provided with a hook 431. A front end portion of the front plate 43 may be provided with a snapping part 432. A protrusion 4321 or a recess or a hole (not shown) is formed on the snapping part 432.

Figure 2:
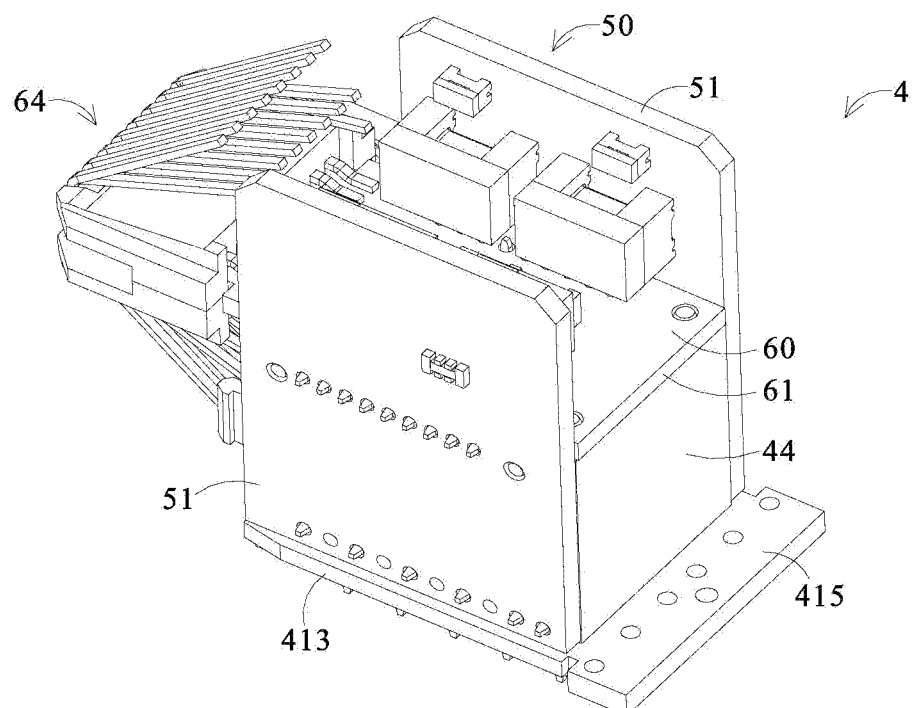
FIG. 2 is a schematic view of the first embodiment of the plug-in module according to the present disclosure.
Figure 3:
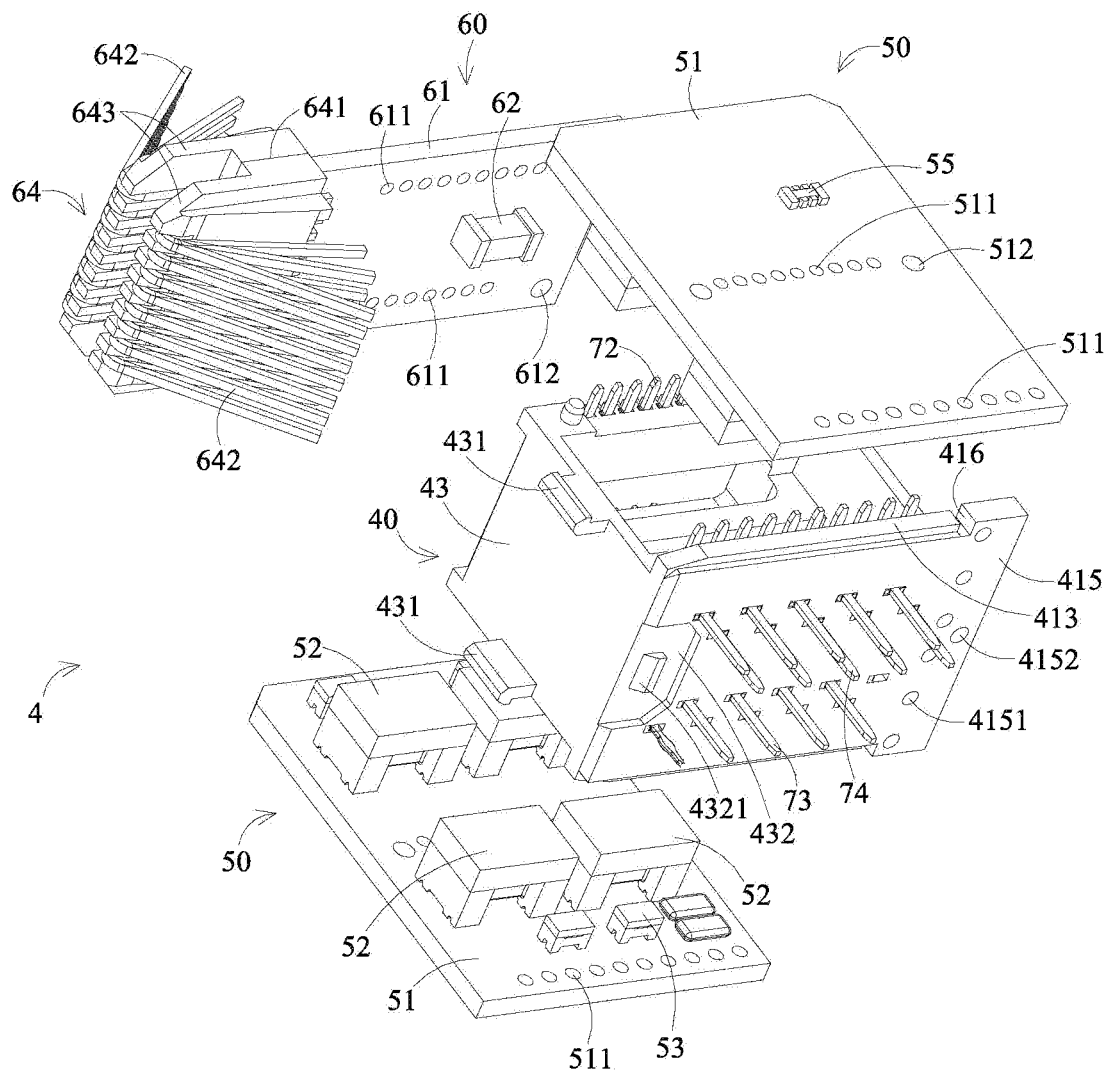
FIG. 3 is a schematic exploded view of the first embodiment of the plug-in module according to the present disclosure.
Figure 6:
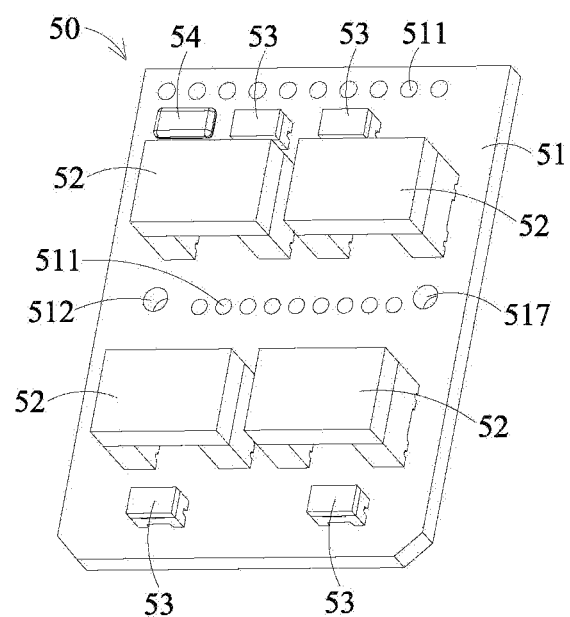
FIG. 6 is a schematic view of an input unit of the first embodiment of the plug-in module according to the present disclosure.

With reference to FIGS. 2, 3 and 6, the input unit 50 includes two input circuit boards 51, but the invention is not limited to this. In a variation embodiment, the input unit 50 may include one input circuit board 51. Each of the input circuit boards 51 may be provided with four channels. Each channel includes an SMD (surface-mounted-device) transformer 52 and an SMD common mode choke coil 53, but the invention is not limited to this.

In a variation embodiment, the channel includes only one SMD transformer 52. In another variation embodiment, the input unit 50 includes one SMD transformer 52 and one or more capacitors 54 electrically coupled to the input circuit board 51. In yet another variation embodiment, the input unit 50 includes one SMD transformer 52, one or more capacitors 54 electrically coupled to the input circuit board 51 and a resistor 55 electrically coupled to the input circuit board 51. In yet another variation embodiment, the input unit 50 includes one SMD transformer 52 and one or more SMD common mode choke coils 53. In the above embodiments, the SMD transformer 52 may be replaced with a conventional winding transformer, and the SMD common mode choke coil 53 may be replaced with a conventional winding common mode choke coil, and the invention is not limited to the above. The numbers of the elements are not limited to the above.

In an embodiment, two rows of through holes 511 electrically coupled to the intermediate terminals are provided on the input circuit board 51, of which one row is located at an end portion of the input circuit board 51 and the other row is located at the middle of the input circuit board 51, so as to evenly separate the four groups of channels into two parts. In other embodiments, it is unnecessary that the other row of through holes 511 is provided at the middle of the input circuit board 51, for example, if the number of the channels in the input circuit board 51 is an odd number, the other row of through holes 511 may be deviated from the middle of the input circuit board 51. The position of the through holes is not a limitation.

In the plug-in module according to the first embodiment, both of the SMD transformer 52 and the SMD common mode choke coil 53 in each channel may be provided on a same surface of the input circuit board 51. The electrical connections on the input circuit board 51 between the SMD transformer 52 and the SMD common mode choke coil 53 in each channel may be implemented through wiring in a same layer in the input circuit board 51, so as to maybe reduce the difficulty in production and design of the circuit board and to maybe reduce the number of through holes. Moreover, it may be beneficial to reduce raw material costs and hours for processing, and to meet the EMI design requirements.

In the plug-in module according to the first embodiment, the number of the channels is not limited to four, and may be one or more.

With reference to FIGS. 1, 2 and 3, two input circuit boards 51 are disposed in parallel and oppositely on the base 40. The base 40 has a height about ½ of a height of each of the input circuit boards 51. Specifically, the two rows of through holes 511 on one of the input circuit boards 51 are respectively inserted with and electrically coupled to the first end portions of both of the first group of intermediate terminals 71 and the first group of input terminals 73 at a left side of the base 40; and the two rows of through holes 511 on the other of the input circuit boards 51 are respectively inserted with and electrically coupled to the first end portions of both of the second group of intermediate terminals 72 and the second group of input terminals 74 at a right side of the base 40. The circuits on the two input circuit boards 51 may be mirror-symmetric such that the channels on the two input circuit boards 51 may face to each other. And in other embodiments, the circuits on the two input circuit boards 51 may not be mirror-symmetric, and the invention is not limited to this.

With reference to FIGS. 1, 2 and 3, the output unit 60 may include an output circuit board 61 and a capacitor 62 electrically coupled to the output circuit board 61. Two sides of the output circuit board 61 respectively have one row of through holes 611. The two rows of through holes 611 are respectively inserted with and electrically coupled to the second end portions of both of the first group of intermediate terminals 71 and the second group of intermediate terminals 72. The second end portions of both of the first group of input terminals 73 and the second group of input terminals 74 extend to the below of the bottom plate 41 of the base 40. Two input circuit boards 51 are respectively provided at the opposed sides of the output circuit board 61. The output circuit board 61 has a height about ½ of the height of each of the input circuit boards 51, and a tip of the output circuit board 61 may extend horizontally beyond each of the input circuit boards 51 at about ½ of the height of each of the input circuit boards 51. In a variation embodiment, there may be one or more capacitors 62 in the output unit 60, and these capacitors may be provided on the same surface of the output circuit board 61 and may be respectively provided on two surfaces of the output circuit board 61, and the invention is not limited to this. The position of the capacitors is not limited to the above. In another variation embodiment, the output unit 60 may only include the output circuit board 61 and does not include the capacitor.

With reference to FIGS. 1, 2 and 3, the output end 64 is fixed and electrically coupled to the front end portion of the output circuit board 61. In the first embodiment, the structure of the output end 64 which is applicable to a 2XN type of electric connector is described, which includes a fixed part 641 fixed to the output circuit board 61 and two groups of docking terminals 642. The fixed part 641 has two opposed extension portions 643. A plurality of docking terminal slots may be provided on each of the extension portions 643. Two groups of docking terminals 642 are fixed to corresponding docking terminal slots on the two extension portions 643 and are electrically coupled to the output circuit board 61.

A top surface and two side surfaces of the top plate 42 of the base 40 are respectively provided with a plurality of fixed bars 423 for fixing the two input circuit boards 51 and the output circuit board 61. Fixed holes 512, 612, which are tightly matched with the fixed bars 423, are provided on the input circuit boards 51 and the output circuit board 61. Each of the input circuit boards 51 and the output circuit board 61 are matched with corresponding fixed bars 423 on the base 40 through fixed holes 512 and 612 thereof, so as to achieve the fixed connection. The input circuit boards 51 are electrically coupled with the output circuit board 61 through the plurality of intermediate terminals, and the input circuit boards 51 are electrically coupled to a customer circuit board through the plurality of input terminals. The output unit is electrically coupled to a connection interface of the user through the output end 64.

In a variation embodiment, the output end may be a structure which is applicable for a 1XN type of electric connector, and form a plug-in module which is applicable for the 1XN type of electric connector together with the corresponding base, the input unit, the output unit and the plurality of input terminals and the plurality of intermediate terminals, but the invention is not limited to this.

A Second Embodiment of a Plug-in Module

Figure 7:
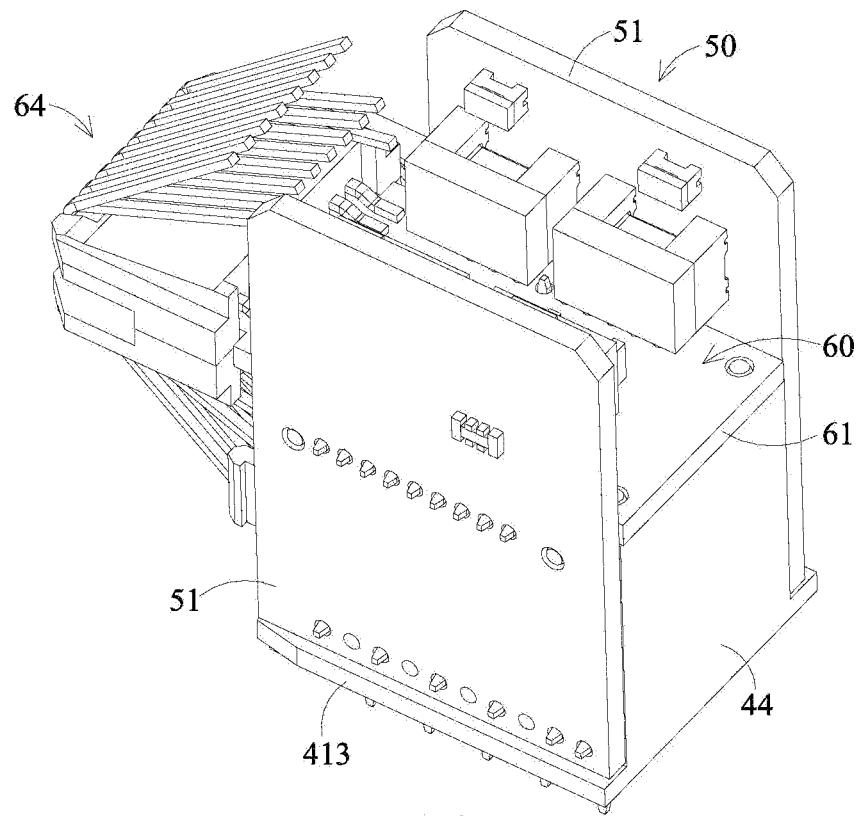
FIG. 7 is a schematic view of a second embodiment of a plug-in module according to the present disclosure.
Figure 8:
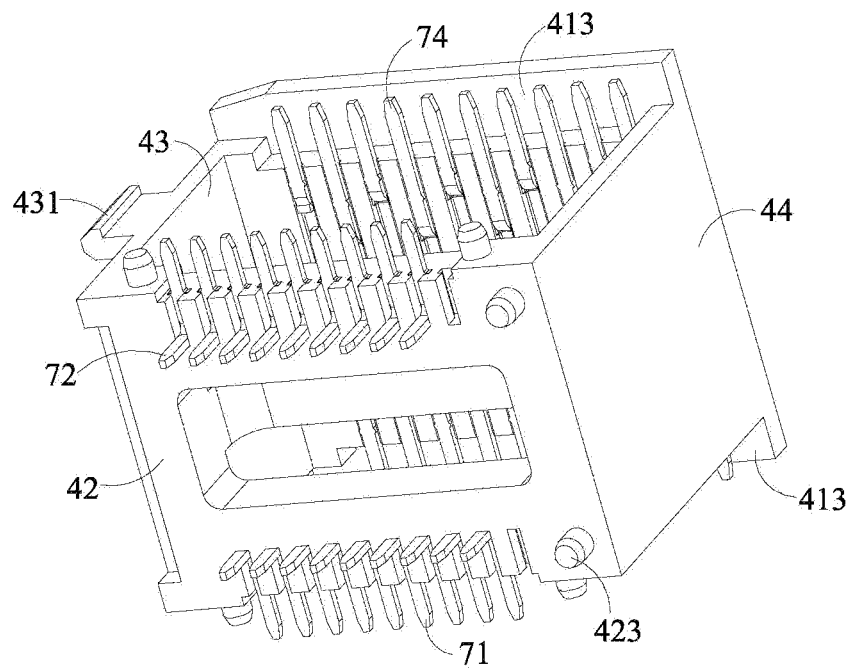
FIG. 8 is a schematic view of an assembly of a base and terminals of the second embodiment of the plug-in module according to the present disclosure.
Figure 10:
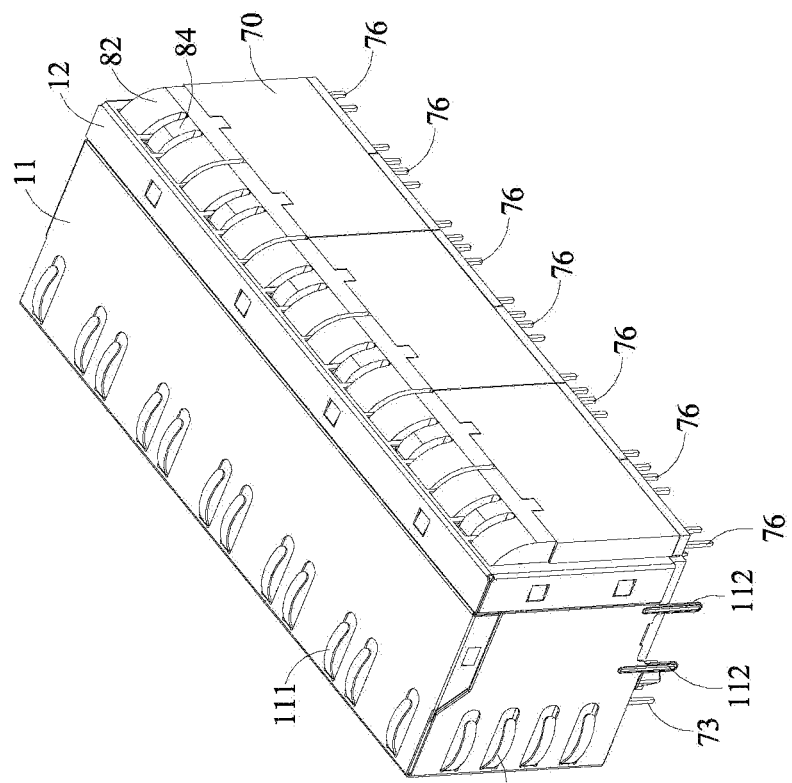
FIG. 10 is a schematic view, viewed from the back, of the first embodiment of the electrical connector according to the present disclosure.
Figure 9:
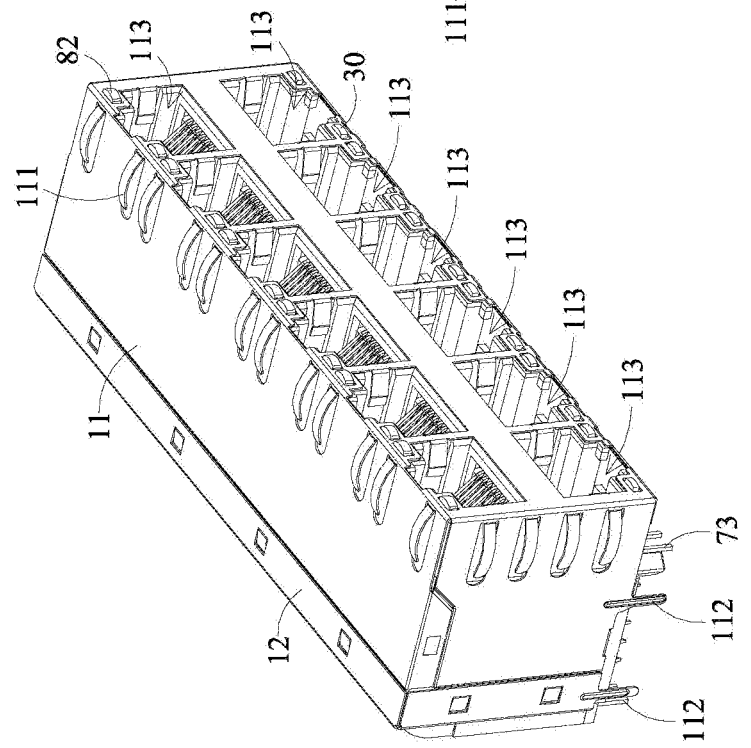
FIG. 9 is a schematic view, viewed from the front, of a first embodiment of an electrical connector according to the present disclosure.

With reference to FIGS. 7 and 8, a plug-in module 4 according to the second embodiment differs from that according to the first embodiment in that the bottom 41 of the base 40 does not have the back extension portion 415.

The other configuration of the plug-in module 4 according to the second embodiment may be the same with that of the plug-in module 4 according to the first embodiment, and will not be repeated herein.

A First Embodiment of an Electric Connector

With reference to FIGS. 9 to 15, an electric connector according to a first embodiment of the present disclosure may be a 2XN type of electric connector which has upper and lower rows of docking sockets and includes an insulator 20, a housing provided outside the insulator 20, a plug-in module 4 and a display device, but the invention is not limited to this, for example, the embodiment may be also used for other types of electric connector.

With reference to FIGS. 11 to 14, the insulator 20 has a rectangular shape, and includes a top wall 21 and a bottom wall 22 opposed to each other, two side walls 23 opposed to each other and a front wall 24. In the insulator 20, a plurality of module sockets 25 are provided along a back-to-front direction, a plurality of pairs of docking sockets 26 are provided along a front-to-back direction, and each of the plurality of pairs of the docking sockets 26 is interconnected with a corresponding module socket 25, but the invention is not limited to this.

Figure 13:
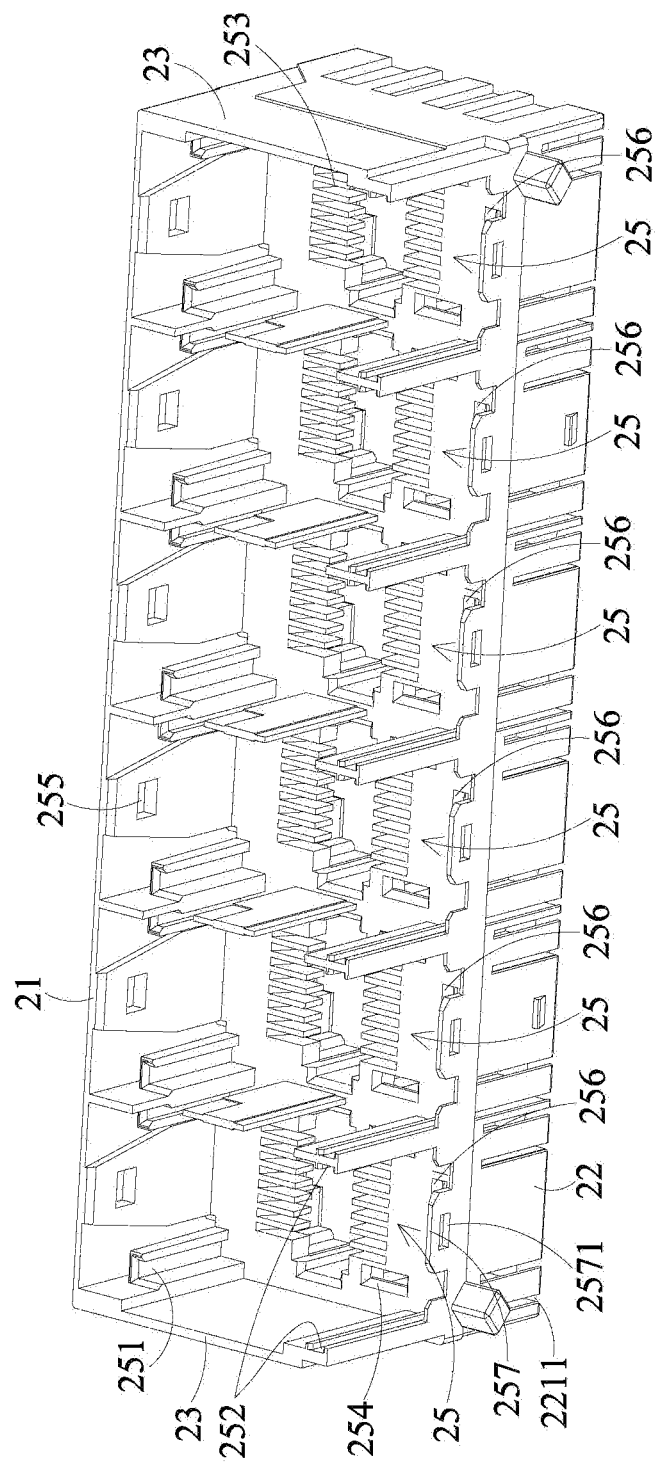
FIG. 13 is a schematic view, viewed from the back, of an insulator of the first embodiment of the electrical connector according to the present disclosure.

With reference to FIG. 13, two sides of an upper end portion in the module socket 25 are respectively provided with a circuit board slot 251 along an inserting direction; two sides of a lower end portion in the module socket 25 are respectively provided with a guide slot 252 along an inserting direction. A docking terminal slot 253 for receiving a part of the docking terminals 642 is provided at a front end portion of the module socket 25. Stop slots 254 are provided at both sides of the docking terminal slot 253. A snap 256 is provided at a front end portion of the bottom inside the module socket 25. The snap may be replaced or changed with other means which may fix the elements of the connector, and the invention is not limited to the above.

Each module socket 25 may be provided with a locking hole 255 on the top wall 21 of the insulator 20.

Figure 14:
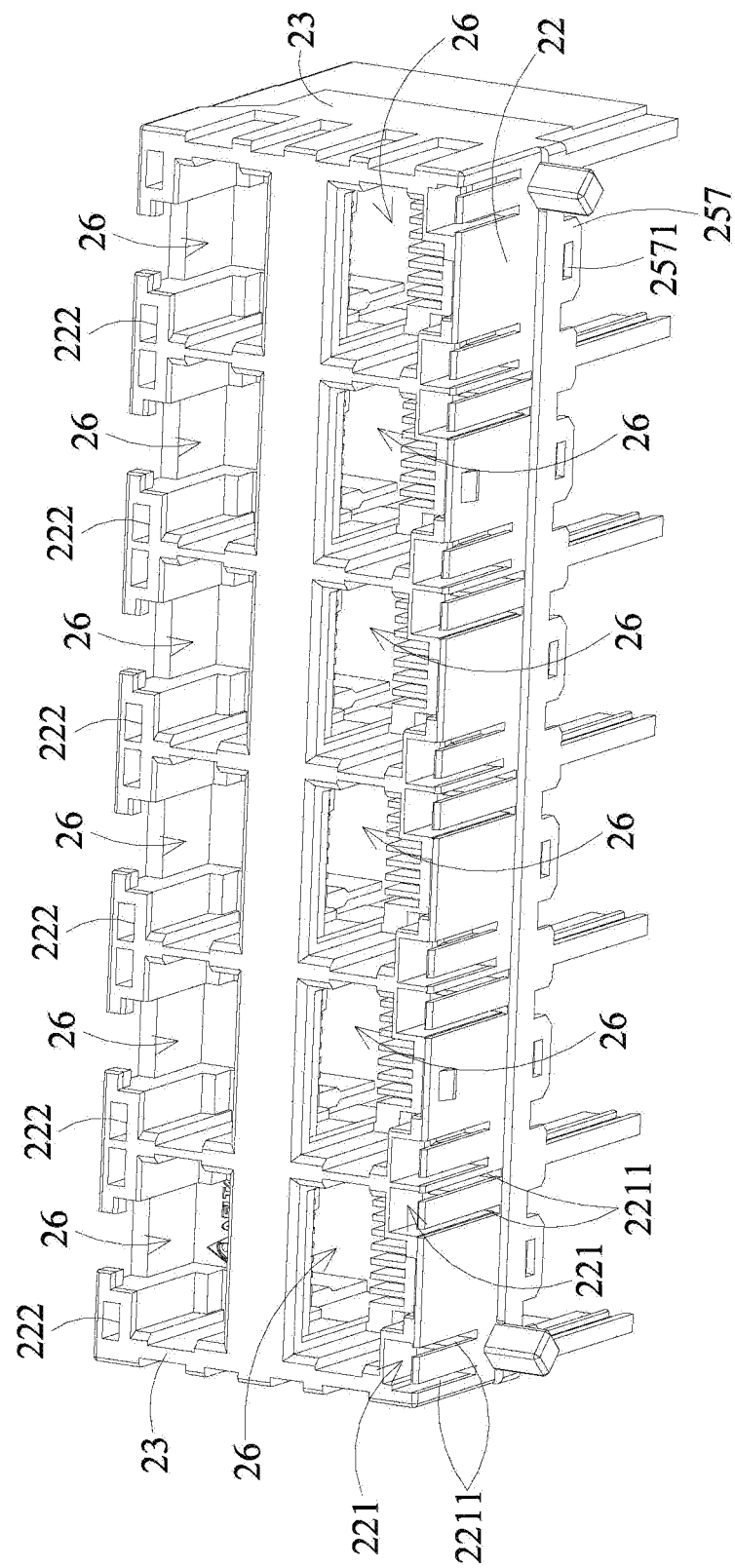
FIG. 14 is a schematic view, viewed from the front, of the insulator of the first embodiment of the electrical connector according to the present disclosure.

With reference to FIG. 14, bottom light slots 221 are provided at both sides of a bottom end portion in each docking socket 26, and the bottom light slots 221 are formed on the bottom wall 22 of the insulator 20 in a front-to-back direction. Each bottom light slot 221 is provided with two openings 2211 on the bottom wall 22. The openings 2211 of two adjacent bottom light slots 221 may be different. Both sides of an inter top end portion of each docking socket 26 on the top wall 21 of the insulation body 20 are provided with a top light slot 222, and the top light slots 222 extend through along the front-to-back direction. A connection lug 257 may be provided on the bottom wall 22 to correspond to each of the module sockets 25. A recess 2571 or a protrusion (not shown) may be provided on the connection lug 257.

With reference to FIGS. 1 to 6, the plug-in module 4 has the structure of the above described plug-in module according to the first embodiment.

With reference to FIGS. 9 to 12, the shape of the housing is matched with the shape of the insulator 20, and the housing may be wrapped around an outside surface of the insulator 20. The housing may include a front housing 11 and a back housing 12 connected with each other in a connection matter such as a snap. Additionally, the housing may be an integral structure or other forms.

Elastic flakes 111 and ground pins 112 are provided on the front housing 11. A plurality of windows 113 may be provided at the front of the front housing 11 to correspond to the plurality of docking sockets 26 of the insulator 20, and a plurality of light openings 114 may be provided to correspond to the plurality of top light slots 222.

A row of through holes 121 are provided at an upper end portion of the back housing 12. A row of fixed holes 122 are provided at a middle portion of the back housing 12. An "L" shaped holding member 123 may be connected to the fixed holes 122.

Figure 15:
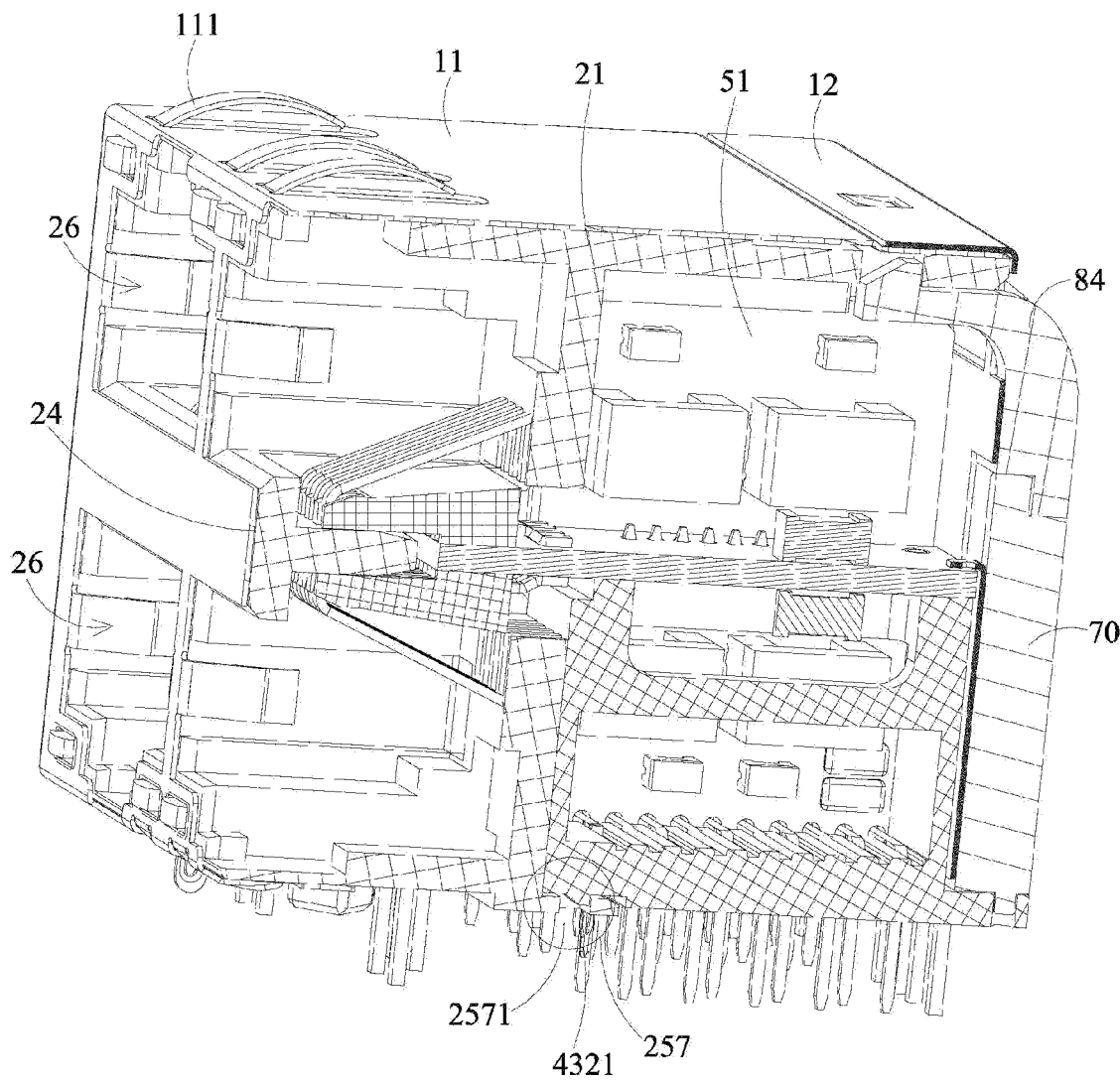
FIG. 15 is a schematic enlarged cross sectional view of the first embodiment of the electrical connector according to the present disclosure.

With reference to FIG. 15, when the plug-in module 4 is assembled inside the insulator 20, the plug-in module 4 is inserted into the module socket 25 along the inserting direction (i.e., from back to front).

After the assembly is completed, the left extension portion 413 and the right extension portion 414 of the bottom plate 41 of the base 40 are respectively coupled inside the two guide slots 252 of the module socket 25; top end portions of the two input units 50 are respectively coupled inside the two circuit board slots 251 of the module socket 25; the two hooks 431 of the front plate 43 of the base 40 are respectively snapped inside the two stop slots 254 of the module socket 25; the two groups of docking terminals 642 are respectively received inside the docking terminal slots 253 of the module socket 25; and the recesses 2571 on the connection lugs 257 of the bottom wall 22 are coupled with the protrusions 4321 on the snapping part 432 of the front plate 43, but the invention is not limited to the above.

Figure 11:
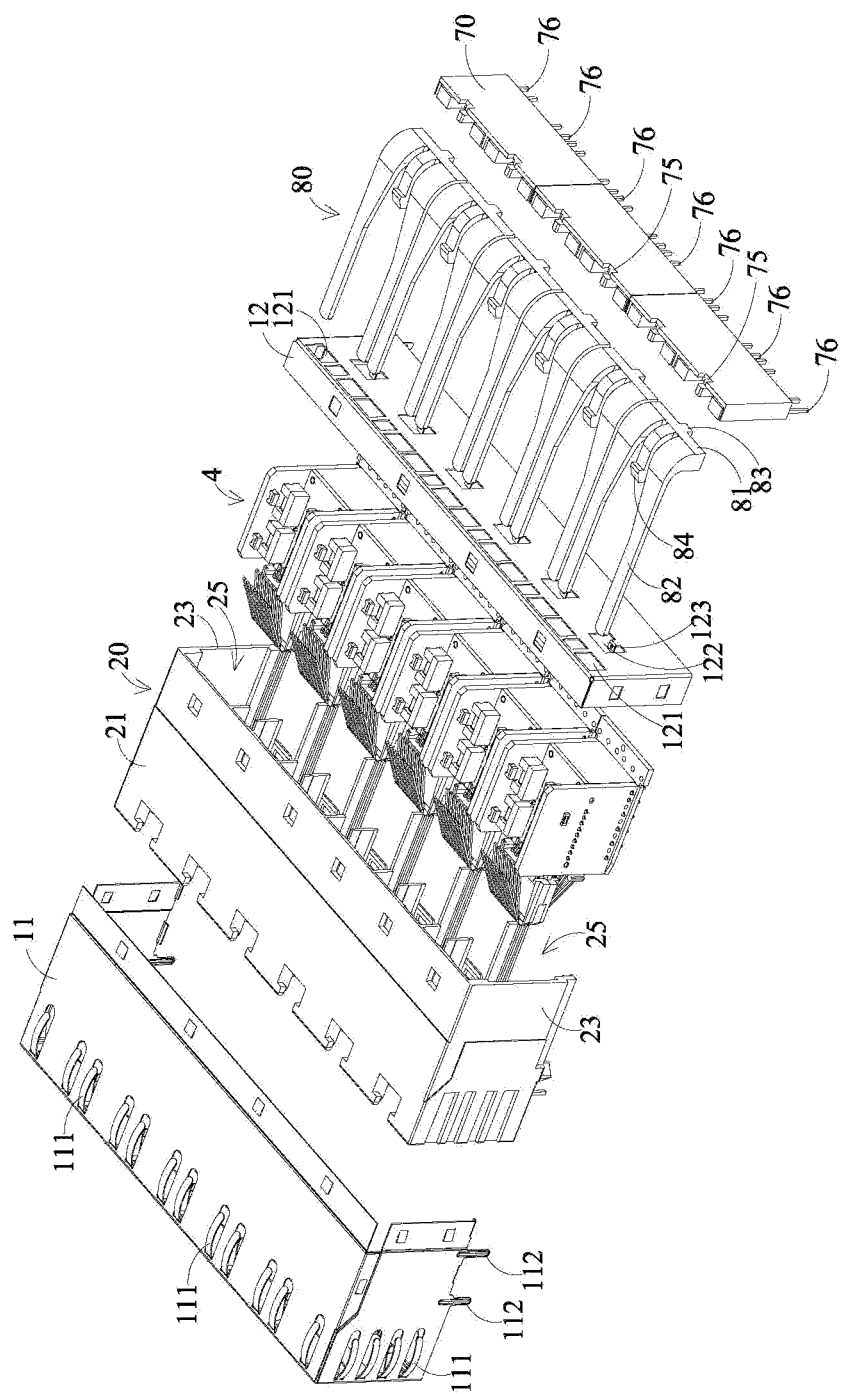
FIG. 11 is a schematic exploded view, viewed from the top, of the first embodiment of the electrical connector according to the present disclosure.
Figure 12:
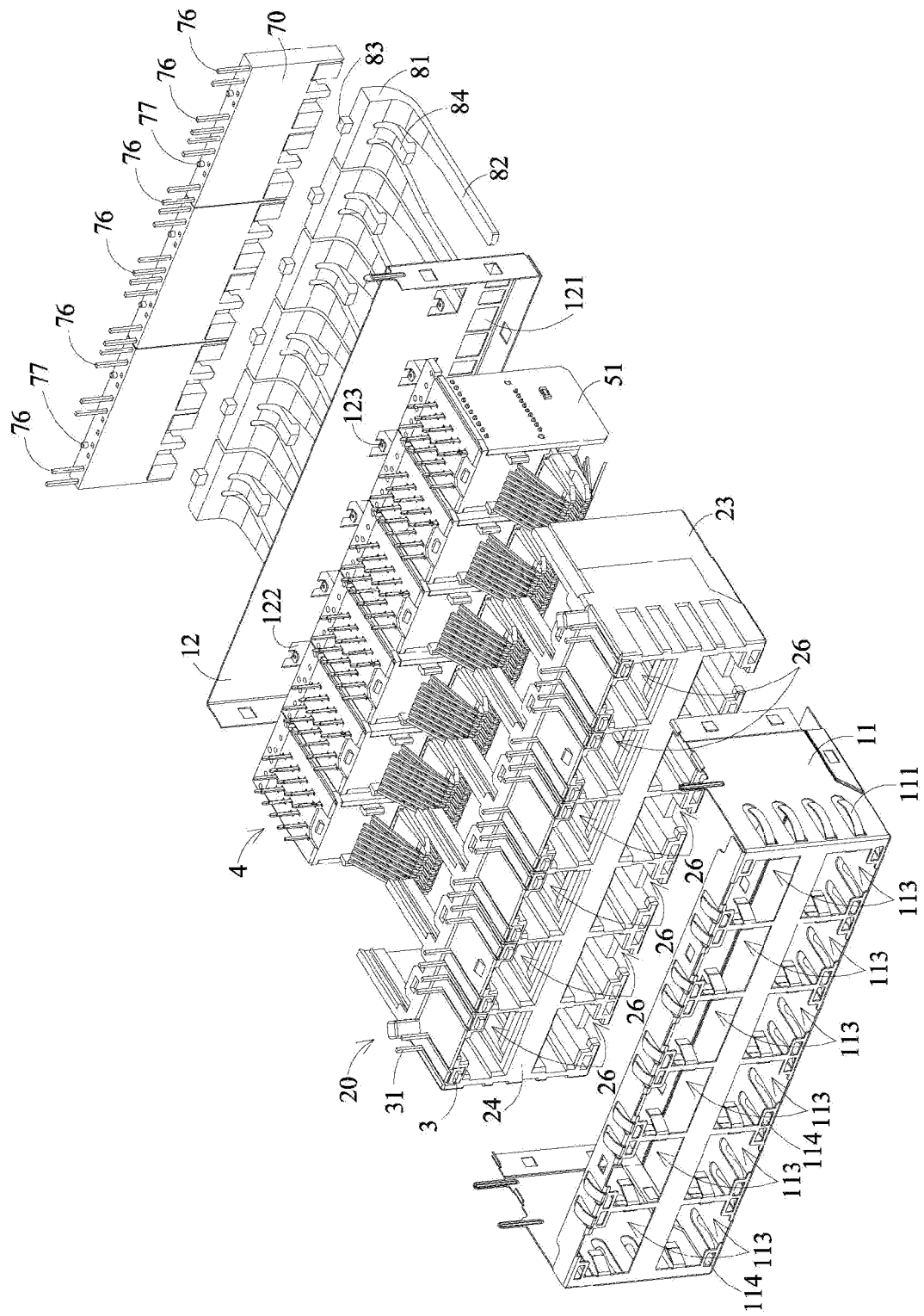
FIG. 12 is a schematic exploded view, viewed from the bottom, of the first embodiment of the electrical connector according to the present disclosure.

With reference to FIGS. 11 and 12, the display device includes a bottom row light display device, and may also include a top row light display device.

The bottom row light display device displays a connection state between a user connection interface and the lower row (a row adjacent to the bottom wall 22 of the insulator 20) of docking sockets 26. The bottom row light display device includes a plurality of LED display lights 30. Each of the LED display lights 30 may have two pins 31. The plurality of LED display lights 30 may be respectively provided in the bottom light slot 221 of the insulator 20, and the two pins 31 may be bent and extended to the below of the bottom wall 22 of the insulator 20 and further extended outside the housing.

The top row light display device displays a connection state between the user connection interface and the upper row (a row adjacent to the top wall 21 of the insulator 20) of docking sockets 26. The top row light display device includes a plurality of light stands 70, LED lights provided in the light stands 70, and a plurality of light guide pillars 80 respectively connected to top end portions of the plurality of light stands 70. Pins 76 of the LED light extend outside a bottom end portion of the light stand 70. A positioning bump 77 is provided at the bottom end portion of the light stand 70. A top end portion of the light stand 70 has a mounting snap 75. The light guide pillar 80 has a mounting part 81 and an extension portion 82 connected to the mounting part 81. The mounting part 81 has a connection bump 83 and an extended forward hook 84. The mounting snap 75 at the top end portion of the light stand 70 may be tightly matched with the connection bump 81.

When the top row light display device is assembled to the base 40 of the plug-in module 4, the extension portion 82 of the light guide pillar 80 passes forward through the through hole 121 provided at the upper portion of the back housing 12 and further into the top light slot 222, until a front end of the extension portion 82 reaches a front end of the top light slot 222; so that the extended forward hook 84 on the light guide pillar 80 is engaged inside the locking hole 255 of the top wall 21 of the insulator 20; and the light stand 70 is mounted to the base 40, specifically as follows: the pins 76 of the LED light mounted inside the light stand 70 passes through the corresponding first positioning hole 4151 on the back extension portion 415 of the base 40 and the housing, and are fixed to the first positioning hole 4151; and the bump 77 at the bottom end portion of the light stand 70 is matched with the second positioning hole 4152 on the back extension portion 415 of the base 40.

In other embodiments, for example, the insulator 20 has only one row of docking sockets 26, and may form a 1XN type of electric connector, which will not be repeated herein.

A Second Embodiment of an Electric Connector

Figure 16:
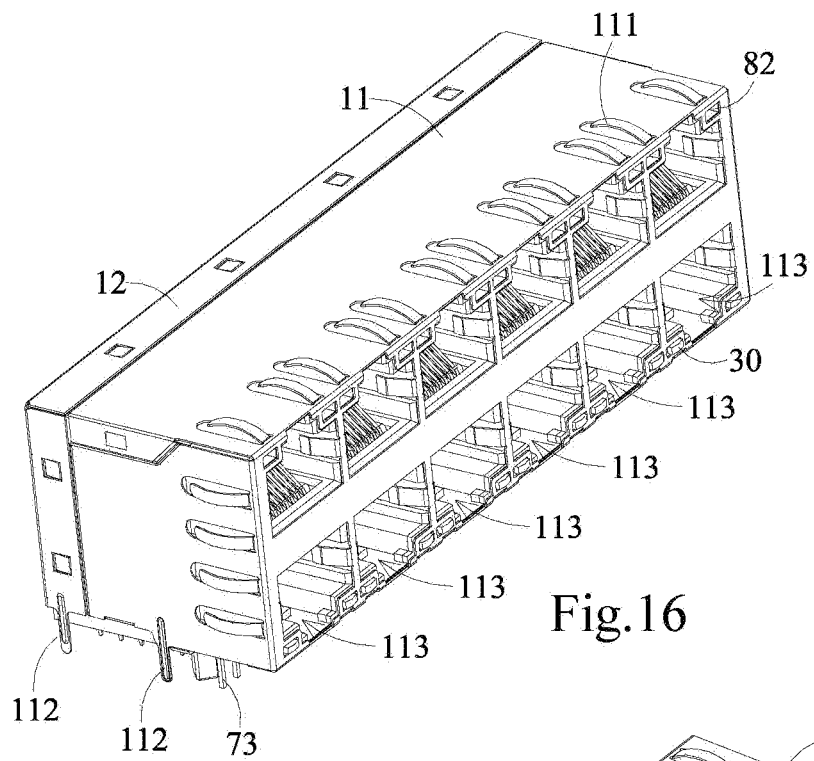
FIG. 16 is a schematic view, viewed from the front, of a second embodiment of an electrical connector according to the present disclosure.
Figure 17:
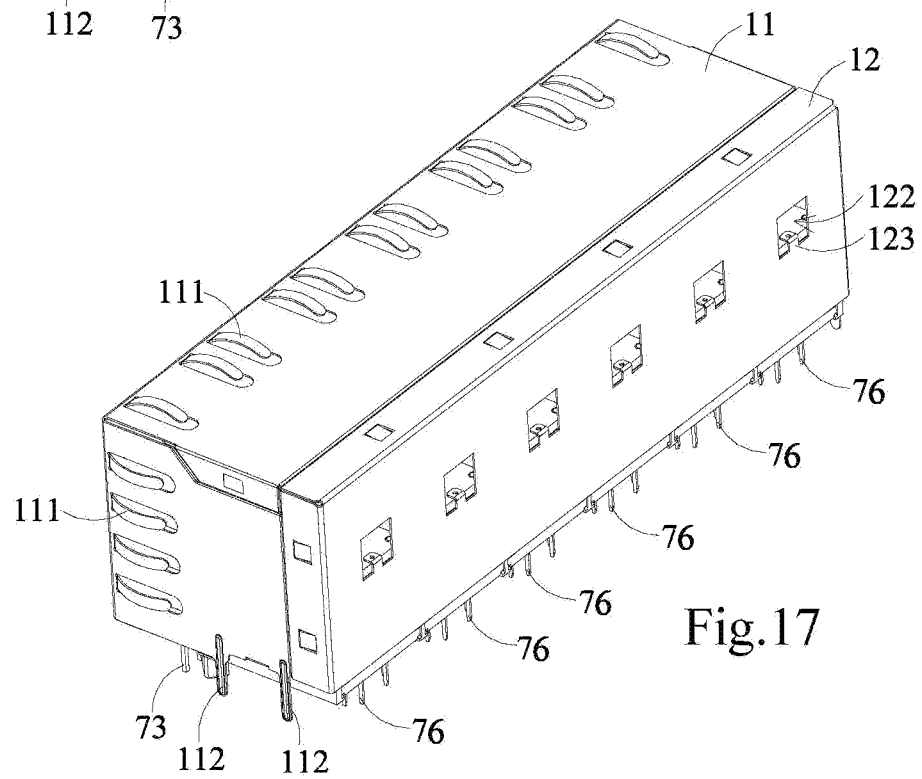
FIG. 17 is a schematic view, viewed from the back, of the second embodiment of the electrical connector according to the present disclosure.

With reference to FIGS. 16 and 17, the difference between the electric connector according to the second embodiment and that according to the first embodiment is as follows.

With reference to FIGS. 7 and 8, the plug-in module 4 has the structure of the above described plug-in module according to the second embodiment. In the second embodiment, the display device only includes the bottom row light display device, and does not include the top row light display device. Accordingly, the top light slots 222 may not be provided on the insulator 20, and the row of through holes 121 may not be provided at the upper end portion of the back housing 12. Additionally, in order to be adaptable to the back housing of the electric connector according to the first embodiment, the row of through holes 121 at the upper end portion of the back housing 12 may be reserved.

In other embodiments, the display device may not be provided, i.e., neither the top row light display device nor the bottom row light display device is provided. In this case, the insulator 20 may not be provided with the bottom light slots 221 and the openings 2211 on the basis of the second embodiment.

An Embodiment of a Production Method of the Plug-in Module

A production method of the plug-in module according to an embodiment includes the following steps.

A base, on which a plurality of input terminals and a plurality of intermediate terminals are fixed, is provided.

An input unit, which includes at least one input circuit board, is produced. At least one channel is provided on each of the input circuit board, and each of the channels includes one transformer electrically coupled to the input circuit board.

An output unit, which includes an output circuit board, is produced.

The at least one input circuit board is vertically provided on the base, and the input circuit board is electrically coupled to an end portion of the input terminal.

The output circuit board is horizontally provided on the base, and the output circuit board is electrically coupled to the input circuit board via the intermediate terminal.

An output end, which is fixed and electrically coupled to the output circuit board, is provided.

In the above steps, there is not a fixed order among the steps of producing the base, the input unit and the output unit; and the orders of the step of fixing the output end to the output unit and the steps of assembling the input unit and the output unit to the base may be interchangeable, but the invention is not limited to this.

The step of producing the base may include: a rectangular frame is produced; a plurality of intermediate terminal slots and input terminal slots is provided on the rectangular frame; and each of the intermediate terminals and input terminals are further fixed.

The step of producing the input unit may further include: a plurality of common mode choke coils corresponding to each transformer are provided; a plurality of capacitors corresponding to each transformer are provided; and a plurality of resistors corresponding to each transformer are provided. The transformer may be a SMD transformer; the transformer, the common mode choke coil and the capacitor may be provided at a same surface and electrically coupled to a same layer inside the input circuit board.

The step of producing an input unit may also include: at least one capacitor is provided on the output circuit board.

In the production method of the plug-in module, various components of the plug-in module, such as the base, the input unit and the output unit, may be produced separately. Therefore, it is easy to produce and suitable for pipeline production, and failure parts may be targeted in detection and may be repaired and replaced independently so as to maybe reduce production cost of the plug-in module.

The exemplary embodiments of the present disclosure have been illustrated and described above. It should be understood that, the present disclosure is not limited to the disclosed embodiments. On the contrary, the present disclosure intends to cover various modifications and equivalent arrangements within the spirit and the scope of the appended claims.

What is claimed is:

1. A plug-in module comprising a base, an input unit, an output unit and an output end, wherein:
the base comprises a top plate, a bottom plate and at least one connection plate connecting the bottom plate and the top plate, a plurality of input terminals and a plurality of intermediate terminals being fixed to the base;
the input unit comprises:
at least one input circuit board provided vertically to the base, and electrically coupled to an end portion of the input terminals; and
at least one channel provided on the input circuit board, each of the at least one channel comprising a transformer electrically coupled to the input circuit board;
the output unit comprises:
an output circuit board horizontally provided to the base, and electrically coupled to the input circuit board via the intermediate terminals; and
the output end fixed to and electrically coupled to the output circuit board.

2. The plug-in module according to claim 1, wherein the input unit comprises:
two input circuit boards respectively provided at opposed two sides of the output circuit board.

3. The plug-in module according to claim 1, wherein each of the at least one channel further comprises:
at least one common mode choke coil electrically coupled to the input circuit board.

4. The plug-in module according to claim 3, wherein the common mode choke coil is a surface-mounted-device (SMD) common mode choke coil; and
the transformer is an SMD transformer.

5. The plug-in module according to claim 1, wherein the base has a height about ½ of a height of the input circuit board.

6. The plug-in module according to claim 1, wherein each of the at least one channel on the input circuit board is provided on a surface of the input circuit board.

7. The plug-in module according to claim 1, wherein each of the input circuit boards is provided with a plurality of channels, and the output circuit board is perpendicular to the input circuit board and divides the plurality of channels on the input circuit board into two parts.

8. The plug-in module according to claim 1, wherein the output circuit board has a height about ½ of a height of the input circuit board, and a tip of the output circuit board extends horizontally beyond the input circuit board.

9. The plug-in module according to claim 1, wherein the connection plate comprises:

a front plate or a back plate perpendicularly connected to and between the bottom plate and the top plate;

wherein, two rows of intermediate terminal slots for fixing the intermediate terminals are provided at a left side and a right side of the top plate; and two rows of input terminal slots for fixing the input terminal are provided at a left side and a right side of the bottom plate.

10. The plug-in module according to claim 1, wherein the plug-in module comprises:

a snapping structure comprising:

two hooks formed at both sides of the connection plate; or a snapping part formed at an end portion of the connection plate.

11. The plug-in module according to claim 1, wherein the bottom plate comprises at least one extension portion.

12. The plug-in module according to claim 11, wherein the bottom plate comprises a left extension portion and a right extension portion.

13. An electric connector comprising:

an insulator, wherein at least one module socket is provided along a direction from back to front, and at least one docking socket is provided along a direction from front to back, and the docking socket and module socket opposed to the docking socket are interconnected with each other;

a housing located outside the insulator; and at least one plug-in module plugged into the at least one module socket correspondingly, the plug-in module being the plug-in module according to claim 1.

14. The electric connector according to claim 13, wherein the electric connector comprises at least one pair of the docking socket, each pair of the docking sockets is arranged on the insulator along an up-to-down direction, and each pair of the docking sockets is interconnected with a corresponding module socket.

15. The electric connector according to claim 13 further comprising:

a circuit board slot respectively provided, along a plug-in direction, at both sides of an upper end portion inside the module socket; or a guide slot respectively provided, along the plug-in direction, at both sides of a lower end portion inside the module socket.

16. The electric connector according to claim 13 wherein the module socket comprises:

a stop structure provided inside the module socket, the stop structure comprising:

stop slots provided at both sides of a front end portion inside the module socket; or a snap provided at a front end of a bottom portion inside the module socket.

17. The electric connector according to claim 13 further comprising:

a display device for displaying a connection state of a network.

18. The electric connector according to claim 17, wherein the bottom plate of the base of the plug-in module comprises:

a back extension portion, at least a part of the display device being located on the back extension portion.

19. A method for manufacturing a plug-in module comprises:

providing a base, wherein a plurality of input terminals and a plurality of intermediate terminals are fixed on the base;

providing an input unit including at least one input circuit board thereon, each of the at least one input circuit board including at least one channel provided thereon and each of the at least one channel comprising a transformer electrically coupled to the input circuit board;

providing an output unit including an output circuit board;

setting the at least one input circuit board vertically to the base, the input circuit board being electrically coupled to an end portion of the input terminal;

setting the output circuit board horizontally to the base, the output circuit board being electrically coupled to the input circuit board via the intermediate terminal; and providing an output end, the output end being fixed to and electrically coupled to the output circuit board.

* * * * *